(12) United States Patent
Lee et al.

(10) Patent No.: US 12,484,148 B2
(45) Date of Patent: Nov. 25, 2025

(54) PRINTED CIRCUIT BOARD

(71) Applicant: SAMSUNG ELECTRO-MECHANICS CO., LTD., Suwon-si (KR)

(72) Inventors: Jin Uk Lee, Suwon-si (KR); Chi Won Hwang, Suwon-si (KR); Eun Sun Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 352 days.

(21) Appl. No.: 17/742,916

(22) Filed: May 12, 2022

(65) Prior Publication Data
US 2023/0199951 A1    Jun. 22, 2023

(30) Foreign Application Priority Data

Dec. 22, 2021   (KR) .................. 10-2021-0184736

(51) Int. Cl.
H05K 1/11   (2006.01)
H05K 1/02   (2006.01)
H05K 1/18   (2006.01)

(52) U.S. Cl.
CPC ........... *H05K 1/111* (2013.01); *H05K 1/0298* (2013.01); *H05K 1/115* (2013.01); *H05K 1/181* (2013.01); *H05K 2201/10159* (2013.01)

(58) Field of Classification Search
CPC ...... H05K 1/02; H05K 1/0298; H05K 1/0313; H05K 1/05; H05K 1/053; H05K 1/111; H05K 1/113; H05K 1/115; H05K 1/181; H05K 3/445; H05K 3/4007; H05K 3/4038; H05K 3/4644; H05K 3/4694; H05K 3/4697; H05K 2201/095; H05K 2201/09827;
(Continued)

(56) References Cited

U.S. PATENT DOCUMENTS 11,178,761 B1 * 11/2021 Cho ................. H05K 1/111
2007/0166881 A1 * 7/2007 Liu .................. H01L 24/11
257/E23.021
(Continued)

FOREIGN PATENT DOCUMENTS

| KR | 10-2017-0083464 A | 7/2017 |
| KR | 10-2020-0028602 A | 3/2020 |
| KR | 10-2020-0066550 A | 6/2020 |
| KR | 10-2021-0053233 A | 5/2021 |
| KR | 10-2021-0073804 A | 6/2021 |

OTHER PUBLICATIONS

Office Action issued in corresponding Korean Patent Application No. 10-2021-0184736 issued on Aug. 21, 2025, with English translation.

*Primary Examiner* — Andargie M Aychillhum
(74) *Attorney, Agent, or Firm* — MORGAN, LEWIS & BOCKIUS LLP

(57) ABSTRACT

A printed circuit board includes: a wiring substrate including a plurality of insulating layers, a plurality of wiring layers, and a plurality of via layers; and a bridge embedded in the wiring substrate and having a plurality of connection pads thereon. An uppermost wiring layer of the plurality of wiring layers includes a plurality of bump pads connected to the plurality of connection pads, and a pitch between at least two adjacent connection pads of the plurality of connection pads is larger than a pitch between at least two adjacent ones of the plurality of bump pads.

11 Claims, 9 Drawing Sheets

(58) Field of Classification Search
CPC .......... H05K 2201/10159; H05K 2201/10734; H01L 21/56; H01L 21/486; H01L 21/565; H01L 21/568; H01L 21/4857; H01L 23/50; H01L 23/66; H01L 23/544; H01L 23/3107; H01L 23/5381; H01L 23/5383; H01L 23/5385; H01L 23/49822; H01L 23/49827; H01L 23/49833; H01L 24/08; H01L 24/13; H01L 24/16; H01L 24/17; H01L 24/19; H01L 24/83; H01L 24/92; H01L 25/0655; H01L 25/50
USPC .............. 361/767; 257/773, 774; 363/37, 67
See application file for complete search history.

(56) References Cited

U.S. PATENT DOCUMENTS

| | | |
|---|---|---|
| 2017/0202083 A1 | 7/2017 | Baek et al. |
| 2019/0139901 A1* | 5/2019 | Scanlan ................ H01L 21/565 |
| 2020/0083179 A1 | 3/2020 | Lee et al. |
| 2020/0176387 A1 | 6/2020 | Yu et al. |
| 2021/0125933 A1 | 4/2021 | Chen et al. |
| 2021/0384130 A1* | 12/2021 | Cheah .................... H01L 24/17 |
| 2023/0066381 A1* | 3/2023 | Lee ..................... H05K 1/0298 |
| 2023/0085944 A1* | 3/2023 | Nie ..................... H01L 23/5385 257/773 |
| 2023/0092740 A1* | 3/2023 | Pietambaram ...... H01L 23/5384 257/773 |
| 2024/0049389 A1* | 2/2024 | Lee ..................... H01L 23/5385 |

* cited by examiner

PRINTED CIRCUIT BOARD

CROSS-REFERENCE TO RELATED APPLICATION(S)

This application claims benefit of priority to Korean Patent Application No. 10-2021-0184736 filed on Dec. 22, 2021 in the Korean Intellectual Property Office, the disclosure of which is incorporated herein by reference in its entirety.

TECHNICAL FIELD

The present disclosure relates to a printed circuit board allowing a bridge for a die-to-die connection to be embedded therein.

BACKGROUND

Recently, with the development of a high-end set and the employment of a high bandwidth memory (HBM), the interposer market for die-to-die electrical connection has grown. As a material of an interposer, silicon is currently mainly used. However, the silicon-based interposer is expensive not only in terms of a material, but also in terms of a manufacturing process because it is complicated to form a through silicon via (TSV) therein.

To solve this problem, a substrate including a silicon-based interconnect bridge capable of electrical die-to-die connection has been developed. However, when the bridge is embedded in the substrate, a very high level of positional accuracy may be required. In addition, the silicon-based interconnect bridge may have a reliability issue due to a mismatch in coefficients of thermal expansion (CTE) between a silicon material of the bridge and an organic material of the substrate, and a cost for manufacturing the silicon-based interconnect bridge may increase because it needs to be manufactured by a semiconductor process.

SUMMARY

An aspect of the present disclosure may provide a printed circuit board allowing a bridge capable of die-to-die interconnection to be embedded therein.

Another aspect of the present disclosure may provide a printed circuit board capable of realizing a high matching level.

Another aspect of the present disclosure may provide a printed circuit board capable of solving a reliability problem.

Another aspect of the present disclosure may provide a printed circuit board capable of reducing costs.

One of several solutions suggested through the present disclosure is to embed in a wiring substrate a bridge including a plurality of connection pads having a sufficient size and a sufficient pitch, such that a plurality of dies disposed on the wiring substrate are electrically connected to each other using the bridge.

According to an aspect of the present disclosure, a printed circuit board may include: a wiring substrate including a plurality of insulating layers, a plurality of wiring layers, and a plurality of via layers; and a bridge embedded in the wiring substrate and having a plurality of connection pads thereon. An uppermost wiring layer of the plurality of wiring layers may include a plurality of bump pads connected to the plurality of connection pads, and a pitch between at least two adjacent connection pads of the plurality of connection pads may be larger than a pitch between at least two adjacent ones of the plurality of bump pads.

According to another aspect of the present disclosure, a printed circuit board may include: a wiring substrate including a plurality of insulating layers, a plurality of wiring layers, and a plurality of via layers; and a bridge embedded in the wiring substrate and having a plurality of connection pads thereon. An uppermost wiring layer of the plurality of wiring layers includes a plurality of bump pads connected to the plurality of connection pads, and at least one of the plurality of connection pads may have a larger area than at least one of the plurality of bump pads in a plan view.

According to another aspect of the present disclosure, a printed circuit board may include: a wiring substrate including a plurality of insulating layers, a plurality of wiring layers, and a plurality of via layers; and a bridge embedded in the wiring substrate and having a plurality of connection pads thereon. An uppermost wiring layer of the plurality of wiring layers may include a plurality of bump pads connected to the plurality of connection pads, the plurality of insulating layers may include a core layer, the wiring substrate may have a cavity penetrating through a portion of the core layer, the bridge may be disposed in the cavity, and side surfaces of the bridge may be spaced apart from the core layer.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Electronic Device

Figure 1:
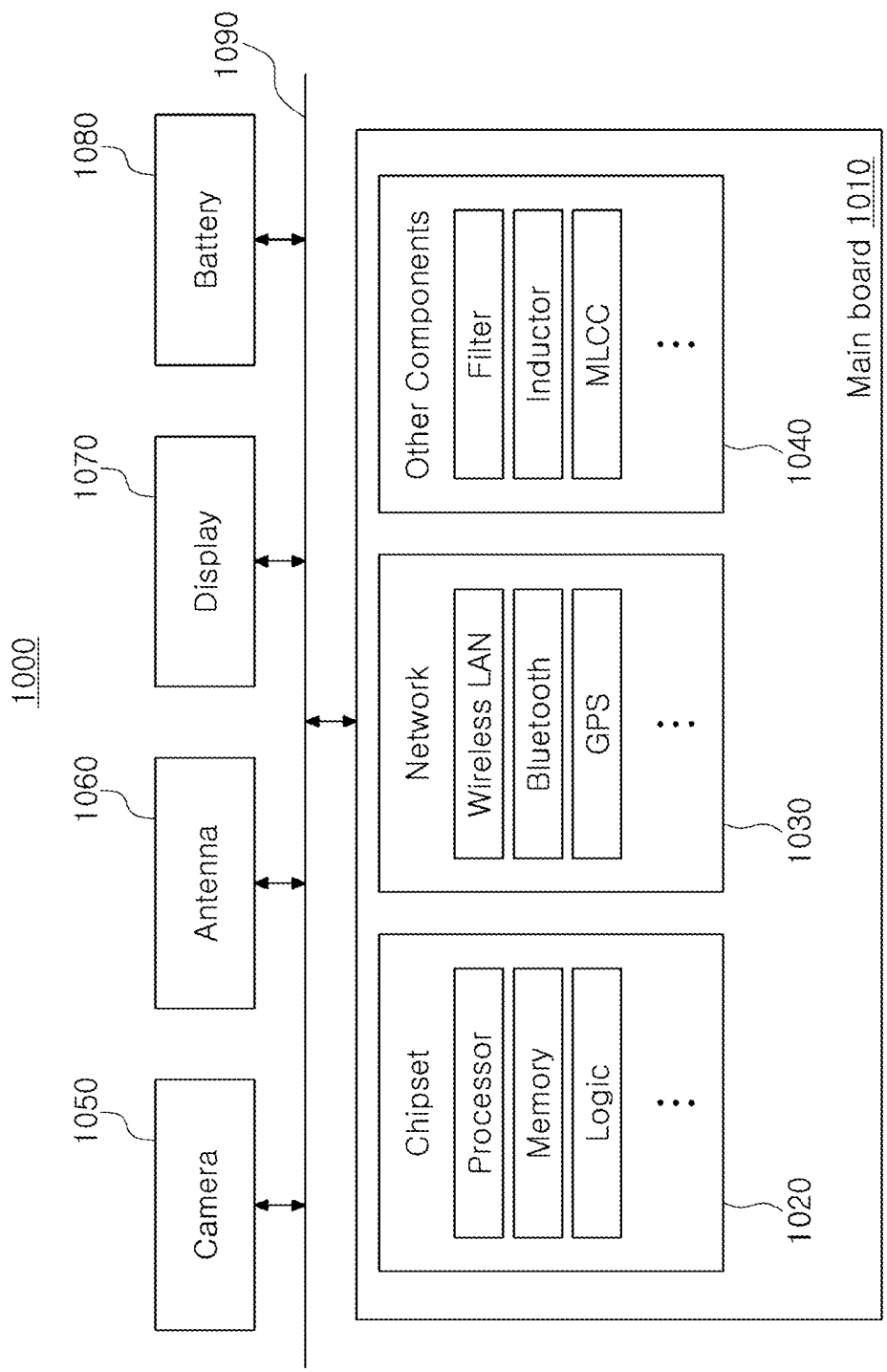
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip-related components 1020, network-related components 1030, and other components 1040, which are physically and/or electrically connected thereto. These components may be connected to other electronic components to be described below to form various signal lines 1090.

The chip-related components 1020 may include a memory chip such as a volatile memory (e.g., a dynamic random access memory (DRAM)), a non-volatile memory (e.g., a read only memory (ROM)), or a flash memory; and a logic chip such as a central processor (e.g., a central processing unit (CPU)), a graphics processor (e.g., a graphics processing unit (GPU)), a digital signal processor, a cryptographic processor, a microprocessor, a microcontroller, an application processor, an analog-to-digital converter, or an application-specific integrated circuit (ASIC). The chip-related components 1020 are not limited thereto, but may also include other types of chip-related electronic components. In addition, the chip-related components 1020 may be combined with each other. The chip-related components 1020 may be in the form of a package including the chips or electronic components described above.

The network-related components 1030 may include protocols such as wireless fidelity (Wi-Fi) (Institute of Electrical and Electronics Engineers (IEEE) 802.11 family or the like), worldwide interoperability for microwave access (WiMAX) (IEEE 802.16 family or the like), IEEE 802.20, long term evolution (LTE), evolution data only (Ev-DO), high speed packet access+(HSPA+), high speed downlink packet access+(HSDPA+), high speed uplink packet access+ (HSUPA+), global system for mobile communications (GSM), enhanced data GSM environment (EDGE), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network-related components 1030 are not limited thereto, but may also include a variety of other wireless or wired standards or protocols. In addition, the network-related components 1030 may be combined with each other, together with the chip-related components 1020.

The other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, the other components 1040 are not limited thereto, but also include passive elements in chip component type used for various other purposes, and the like. In addition, the other components 1040 may be combined with each other, together with the chip-related components 1020 and/or the network-related components 1030.

Depending on the type of electronic device 1000, the electronic device 1000 may include other electronic components that may or may not be physically and/or electrically connected to the mainboard 1010. Examples of the other electronic components may include a camera 1050, an antenna 1060, a display 1070, a battery 1080, and the like. The other electronic components are not limited thereto, but may be an audio codec, a video codec, a power amplifier, a compass, an accelerometer, a gyroscope, a speaker, a mass storage unit (e.g., a hard disk drive), a compact disk (CD), a digital versatile disk (DVD), and the like. The other electronic components may also include other electronic components and the like used for various purposes depending on the type of electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
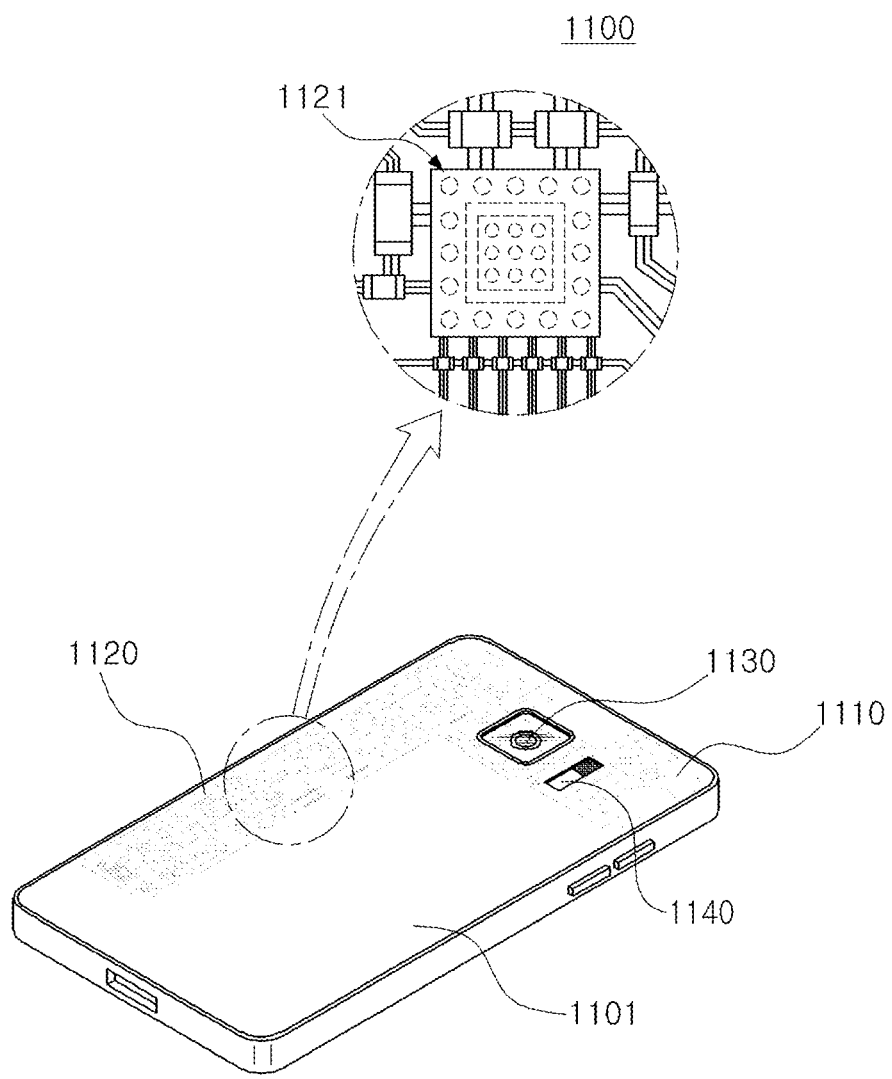
FIG. 2 is a schematic perspective view illustrating an example of an electronic device.

FIG. 2 is a schematic perspective view illustrating an example of an electronic device.

Referring to FIG. 2, the electronic device may be, for example, a smartphone 1100. A motherboard 1110 may be accommodated in the smartphone 1100, and various components 1120 may be physically and/or electrically connected to the motherboard 1110. Also, other components that may or may not be physically and/or electrically connected to the motherboard 1110, such as a camera module 1130 and/or a speaker 1140, may be accommodated in the smartphone 1100. Some of the components 1120 may be the above-described chip-related components, e.g., a component package 1121, but are not limited thereto. The component package 1121 may be in the form of a printed circuit board on which electronic components including active components and/or passive components are surface-mounted. Alternatively, the component package 1121 may be in the form of a printed circuit board in which active components and/or passive components are embedded. Meanwhile, the electronic device is not necessarily limited to the smartphone 1100, but may be any other electronic device as described above.

Semiconductor Package Including Organic Interposer

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip may not be used by itself, and the semiconductor chip may be packaged for use in an electronic device or the like in a packaged state.

In terms of electrical connection, semiconductor packaging is required because there is a difference in circuit width between the semiconductor chip and a mainboard of the electronic device. Specifically, a size of connection pads and an interval between the connection pads in the semiconductor chip are very fine, whereas a size of component mounting pads and an interval between the component mounting pads in the mainboard used for the electronic device are much larger than those in the semiconductor chip. Therefore, it is difficult to directly mount the semiconductor chip on the mainboard, and packaging technology for buffering the difference in circuit width between the semiconductor chip and the mainboard is required.

A semiconductor package including an organic interposer manufactured by the packaging technology described above will hereinafter be described in more detail with reference to the drawings.

Figure 3:
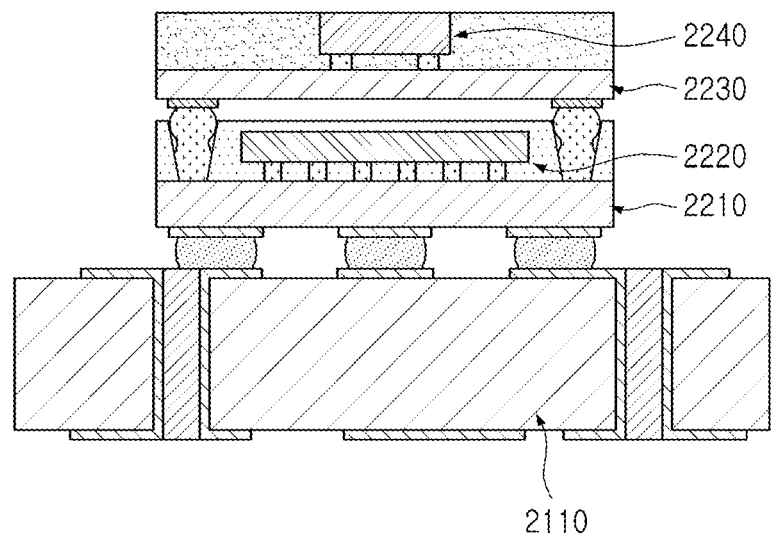
FIG. 3 is a schematic cross-sectional view illustrating that a ball grid array (BGA) package is mounted on a mainboard of an electronic device.

FIG. 3 is a schematic cross-sectional view illustrating that a ball grid array (BGA) package is mounted on a mainboard of an electronic device.

Among semiconductor chips, chips in an ASIC such as a GPU are very expensive, and it is thus very important to perform packaging on the ASIC at a high yield. For this purpose, a BGA substrate 2210 or the like capable of redistributing several thousands to several hundreds of thousands of connection pads may be prepared before a semiconductor chip is mounted, and a high-price semiconductor chip, such as a GPU 2220, may be mounted and packaged on the BGA substrate 2210 using surface mounting technology (SMT) or the like, and then mounted finally on a mainboard 2110.

Meanwhile, the GPU 2220 needs to minimize a signal path to a memory such as a high bandwidth memory (HBM). To this end, a semiconductor chip such as the HBM 2240 may be mounted and then packaged on an interposer 2230, and a package in which the semiconductor chip is mounted may be stacked on a package in which the GPU 2220 is mounted in a package-on-package (POP) form. However, in this case, a device is excessively thick, and accordingly, there is a limit in minimizing the signal path.

Figure 4:
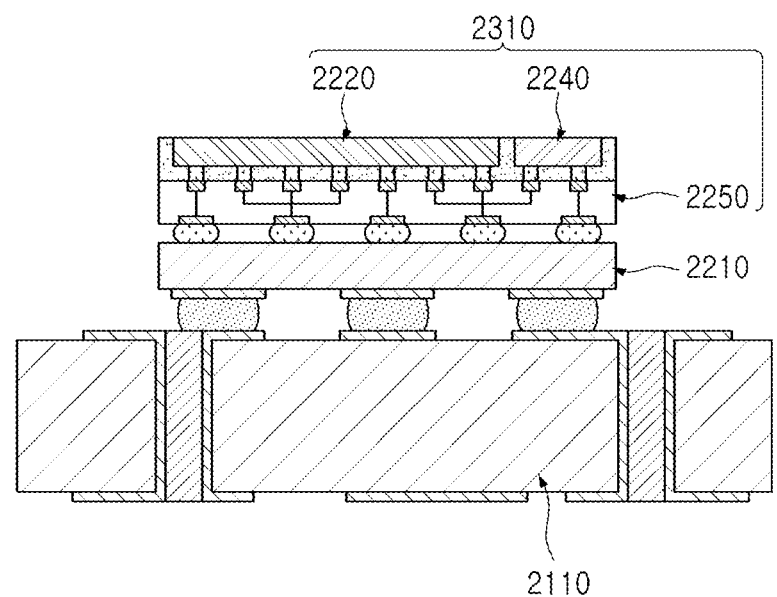
FIG. 4 is a schematic cross-sectional view illustrating that a silicon interposer package is mounted on a mainboard.

FIG. 4 is a schematic cross-sectional view illustrating that a silicon interposer package is mounted on a mainboard.

As a way to solve the problem described above, it may be considered to manufacture a semiconductor package 2310 including a silicon interposer by surface-mounting and then packaging a first semiconductor chip such as a GPU 2220 and a second semiconductor chip such as an HBM 2240 side by side on a silicon interposer 2250 as an interposer technique. In this case, the GPU 2220 and the HBM 2240 having several thousands to several hundreds of thousands of connection pads may be redistributed through the interposer 2250, and may be electrically connected to each other through a shortest path. In addition, the semiconductor package 2310 including the silicon interposer may be mounted and redistributed on a BGA substrate 2210 or the like, and then mounted finally on a mainboard 2110. However, it is very difficult to form a through silicon via (TSV) or the like in the silicon interposer 2250, and a cost required for manufacturing the silicon interposer 2250 is significantly high. Thus, the silicon interposer 2250 is disadvantageous in increasing an area and reducing a cost.

Figure 5:
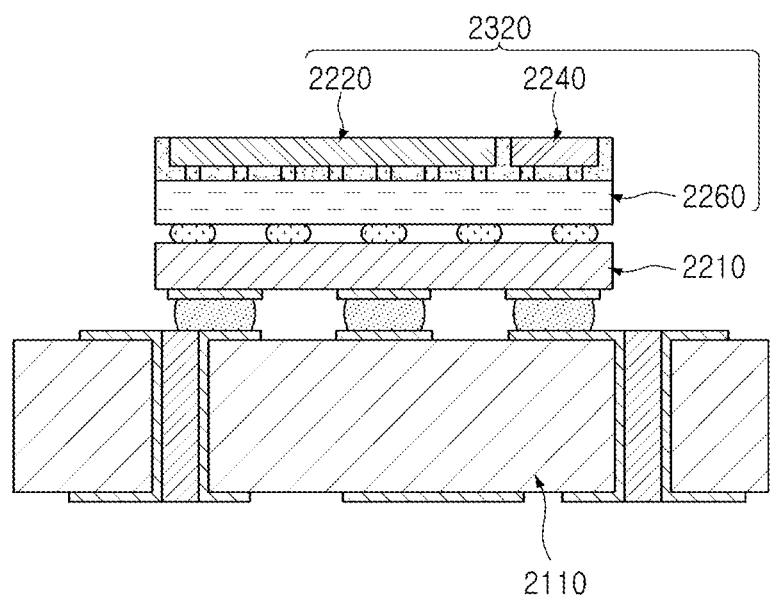
FIG. 5 is a schematic cross-sectional view illustrating that an organic interposer package is mounted on a mainboard.

FIG. 5 is a schematic cross-sectional view illustrating that an organic interposer package is mounted on a mainboard.

As a way to solve the problem described above, it may be considered to use an organic interposer 2260 instead of the silicon interposer 2250. For example, it may be considered to manufacture a semiconductor package 2320 including an organic interposer by surface-mounting and then packaging a first semiconductor chip such as a GPU 2220 and a second semiconductor chip such as an HBM 2240 side by side on the organic interposer 2260 as an interposer technique. In this case, the GPU 2220 and the HBM 2240 having several thousands to several hundreds of thousands of connection pads may be redistributed through the interposer 2260, and may be electrically connected to each other through a shortest path. In addition, the semiconductor package 2320 including the organic interposer may be mounted and redistributed on a BGA substrate 2210 or the like, and then mounted finally on a mainboard 2110. The organic interposer 2260 is advantageous in increasing an area and reducing a cost.

Meanwhile, the semiconductor package 2320 including the organic interposer may be manufactured by performing a packaging process for molding the semiconductor chips 2220 and 2240 after being mounted on the interposer 2260. If such a molding process is not performed, it is not possible to handle the semiconductor chips 2220 and 2240, and accordingly, it is not possible to connect the semiconductor chips 2220 and 2240 to the BGA substrate 2210 or the like. Therefore, rigidity may be maintained through the molding process. However, when the molding process is performed, a mismatch in coefficient of thermal expansion (CTE) between the interposer 2260 and the molding material of the semiconductor chips 2220 and 2240 may cause warpage, deterioration in fillability of underfill resin, and a crack between the die and the molding material as described above.

Printed Circuit Board Including Bridge

Hereinafter, a printed circuit board having a new structure in which a bridge capable of interconnecting dies is embedded in a wiring substrate will be described with reference to the drawings.

In a case where the printed circuit board to be described below is used as a BGA substrate or the like of a semiconductor package, the above-described separate interposer may be omitted if necessary.

Figure 6:
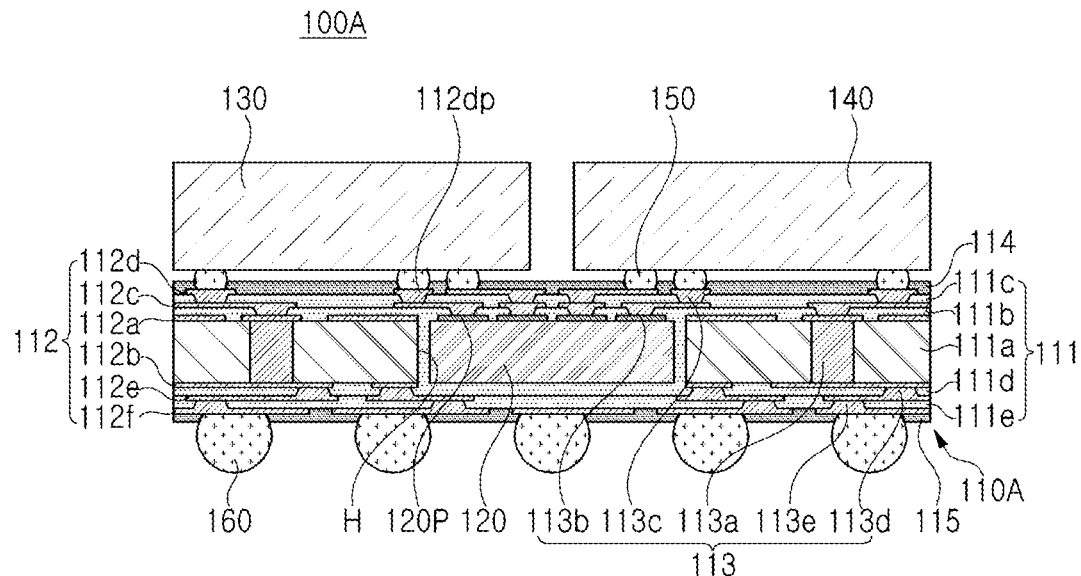
FIG. 6 is a schematic cross-sectional view illustrating a printed circuit board according to an exemplary embodiment.

FIG. 6 is a schematic cross-sectional view illustrating a printed circuit board according to an exemplary embodiment.

Referring to FIG. 6, the printed circuit board 100A according to an exemplary embodiment may include: a wiring substrate 110A including a plurality of insulating layers 111, a plurality of wiring layers 112, and a plurality of via layers 113; and a bridge 120 embedded in the wiring substrate 110A and having a plurality of connection pads 120P thereon. If necessary, the printed circuit board 100A according to an exemplary embodiment may further include: a first passivation layer 114 disposed on an upper side of the plurality of insulating layers 111; a second passivation layer 115 disposed on a lower side of the plurality of insulating layers 111; a plurality of connection conductors 150 disposed on an upper side of the plurality of wiring layers 112; a plurality of electrical connection metals 160 disposed on a lower side of the plurality of wiring layers 112; and/or a plurality of dies 130 and 140 mounted on the wiring substrate 110A.

The wiring substrate 110A may include a plurality of insulating layers 111, a plurality of wiring layers 112, and a plurality of via layers 113. The wiring substrate 110A may be a core substrate. For example, the plurality of insulating layers 111 may include: a core layer 111a; a plurality of first build-up layers 111b and 111c disposed on an upper side of the core layer 111a; and a plurality of second build-up layers 111d and 111e disposed on a lower side of the core layer 111a. In addition, the plurality of wiring layers 112 may include: a first core wiring layer 112a disposed on an upper surface of the core layer 111a; a second core wiring layer 112b disposed on a lower surface of the core layer 111a; a plurality of first build-up wiring layers 112c and 112d disposed on the plurality of first build-up layers 111b and 111c, respectively; and a plurality of second build-up wiring layers 112e and 112f disposed on the plurality of second build-up layers 111d and 111e, respectively. In addition, the plurality of via layers 113 may include: a through via layer 113a penetrating through the core layer 111a and connected to the first and second core wiring layers 112a and 112b; a plurality of first connection via layers 113b and 113c penetrating through the plurality of first build-up layers 111b and 111c, respectively, and connected to the plurality of first build-up wiring layers 112c and 112d, respectively; and a plurality of second connection via layers 113d and 113e penetrating through the plurality of second build-up layers 111d and 111e, respectively, and connected to the plurality of second build-up wiring layers 112e and 112f, respectively.

The core layer 111a may function as a central layer of the wiring substrate 110A, and may impart rigidity. A material of the core layer 111a is not particularly limited. For example, the core layer 111a may be formed using an insulating material. In this case, the insulating material may be a thermosetting resin such as an epoxy resin, a thermoplastic resin such as a polyimide resin, or a resin in which the thermosetting or thermoplastic resin is mixed with an inorganic filler such as silica or impregnated together with an inorganic filler in a core material such as a glass fiber (glass cloth or glass fabric), for example, prepreg, Ajinomoto build-up film (ABF), FR-4, or bismaleimide triazine (BT), but is not limited thereto. The core layer 111a may be introduced using a copper clad laminate (CCL). The core layer 111a may be thicker than each of the plurality of first and second build-up layers 111b, 111c, 111d, and 111e.

The plurality of first and second build-up layers 111b, 111c, 111d, and 111e may be introduced on both sides of the core layer 111a for build-up purposes. A material of the plurality of first and second build-up layers 111b, 111c, 111d, and 111e is also not particularly limited. For example, the plurality of first and second build-up layers 111b, 111c, 111d, and 111e may be formed using an insulating material. In this case, the insulating material may be a thermosetting resin such as an epoxy resin, a thermoplastic resin such as a polyimide resin, or a resin in which the thermosetting or thermoplastic resin is mixed with an inorganic filler such as silica or impregnated in a core material of an inorganic filler, for example, prepreg, ABF, FR-4, or BT, but is not limited thereto. The plurality of first and second build-up layers 111b, 111c, 111d, and 111e may be built up on both sides of the core layer 111a in the same manner, and thus, the number of first build-up layers may be the same as the number of second build-up layers. The number of first and second build-up layers is not particularly limited, and may be modified in various manners depending on design. A boundary between the plurality of first build-up layers 111b and 111c and a boundary between the plurality of second build-up layers 111d and 111e may be distinct, or the plurality of first build-up layers 111b and 111c and the plurality of second build-up layers 111d and 111e may be integrated with each other to such an extent that a boundary therebetween is obscure.

The first and second core wiring layers 112a and 112b and the plurality of first and second build-up wiring layers 112c, 112d, 112e, and 112f may perform various functions in the wiring substrate 110A depending on how the respective layers are designed. For example, the first and second core wiring layers 112a and 112b and the plurality of first and second build-up wiring layers 112c, 112d, 112e, and 112f may include ground patterns, power patterns, signal patterns, and the like. Here, the signal patterns may include various signals, e.g., data signals, other than ground patterns, power patterns, and the like. Each of these patterns may include a line pattern, a plane pattern, and/or a pad pattern. The first and second core wiring layers 112a and 112b and the plurality of first and second build-up wiring layers 112c, 112d, 112e, and 112f may be formed using a conductive material, in particular a metal material, such as copper (Cu), aluminum (Al), silver (Ag), tin (Sn), gold (Au), nickel (Ni), lead (Pb), titanium (Ti), or an alloy thereof. Each of the first and second core wiring layers 112a and 112b and the plurality of first and second build-up wiring layers 112c, 112d, 112e, and 112f may include an electroless plating layer (or chemical copper) and an electrolytic plating layer (or electrical copper).

The through via layer 113a may electrically connect the first and second core wiring layers 112a and 112b formed in different layers, as a result forming an electrical path in the wiring substrate 110A. The through via layer 113a may perform various functions in the wiring substrate 110A depending on design. For example, the through via layer 113a may include a ground through via, a power through via, a signal through via, or the like. The through via layer 113a may include a plurality of through vias. Each of the through vias in the through via layer 113a may include a conductive material, in particular a metal material, such as copper (Cu), aluminum (Al), silver (Ag), tin (Sn), gold (Au), nickel (Ni), lead (Pb), titanium (Ti), or an alloy thereof. Each of the through vias in the through via layer 113a may include an electroless plating layer (or chemical copper) and an electrolytic plating layer (or electrical copper). Each of the through vias in the through via layer 113a may be of a type in which a via hole is filled with the conductive material, or may be of a conformal type in which the conductive material is disposed along a wall surface of a via hole. Each of the through vias in the through via layer 113a may have an hourglass shape, a cylindrical shape, or the like.

The plurality of first and second connection via layers 113b, 113c, 113d, and 113e may electrically connect the first and second core wiring layers 112a and 112b formed on different layers and the plurality of first and second build-up wiring layers 112b, 112c, 112d, and 112e, as a result forming an electrical path in the wiring substrate 110A. The plurality of first and second connection via layers 113b, 113c, 113d, and 113e may perform various functions in the wiring substrate 110A depending on how the respective layers are designed. Each of the plurality of first and second connection via layers 113b, 113c, 113d, and 113e may include a ground connection via, a power connection via, a signal connection via, or the like. Each of the plurality of first and second connection via layers 113b, 113c, 113d, and 113e may include a plurality of connection vias. Each of the connection vias in the plurality of first and second connection via layers 113b, 113c, 113d, and 113e may include a conductive material, in particular a metal material, such as copper (Cu), aluminum (Al), silver (Ag), tin (Sn), gold (Au), nickel (Ni), lead (Pb), titanium (Ti), or an alloy thereof. Each of the connection vias in the plurality of first and second connection via layers 113b, 113c, 113d, and 113e may include an electroless plating layer (or chemical copper) and an electrolytic plating layer (or electrical copper). Each of the connection vias in the plurality of first and second connection via layers 113b, 113c, 113d, and 113e may be of a type in which a via hole is filled with the conductive material, or may be of a conformal type in which the conductive material is disposed along a wall surface of a via hole. Each of the connection vias in the plurality of first and second connection via layers 113b, 113c, 113d, and 113e may have a tapered shape. For example, the connection vias in the plurality of first connection via layers 113b and 113c and the connection vias in the plurality of second connection via layers 113d and 113e may be tapered in opposite directions.

The passivation layers 114 and 115 may be disposed on the both outermost sides of the wiring substrate 110A, respectively, to protect components inside the wiring substrate 110A. The passivation layers 114 and 115 may have a plurality of openings formed therein to partially expose the uppermost wiring layer 112d and the lowermost wiring layer 112f of the plurality of wiring layers 112, respectively. A material of the passivation layers 114 and 115 is not particularly limited. For example, the passivation layers 114 and 115 may be formed using an insulating layer. In this case, the insulating layer may be solder resist. However, the passivation layers 114 and 115 are not limited thereto, and may be formed using ABF or the like.

The wiring substrate 110A may have a through portion H penetrating through the core layer 111a. The bridge 120 may be disposed in the through portion H. In addition, at least a portion of the through portion H may be filled by at least a portion of at least one build-up layer 111b of the plurality of first build-up layers 111b and 111c. However, the through portion H is not limited thereto, and at least a portion of the through portion H may be filled by at least a portion of at least one build-up layer 111d of the plurality of second build-up layers 111d and 111e if necessary.

The bridge 120 may provide die-to-die interconnection or the like. The bridge 120 may be a silicon bridge manufactured by forming a circuit layer through a deposition process using a silicon dioxide as an insulating body, an organic bridge manufactured by forming a circuit layer through a plating process or the like using an organic insulating material as an insulating body, or the like, and may be preferably an organic bridge. Therefore, unlike the silicon bridge, the organic bridge may hardly cause a reliability problem resulting from a mismatch in CTE even though it is disposed in the wiring substrate 110A. In addition, the organic bridge may reduce a level of process difficulty and a material cost for forming the bridge 120. More preferably, as will be described below, the bridge 120 may include a multilayer substrate manufactured using a PCB manufacturing process, e.g., a multilayer coreless substrate.

The bridge 120 may be disposed in the through portion H. For example, the bridge 120 may be disposed in the through portion H in a face-up form so that the plurality of connection pads 120P face upward. In this way, since the bridge 120 is disposed in the through portion H of the core layer 111a, it is possible to sufficiently secure a thickness of the bridge 120. Thus, the bridge 120 can be manufactured in a multilayer structure. In a case where the multilayer structure is adopted instead of a microcircuit structure, the bridge 120 can be manufactured using a general PCB manufacturing process. In this case, the printed circuit board can be manufactured in an easier manner, while reducing a manufacturing cost. In addition, the plurality of connection pads 120P can be formed in a large size, thereby making it possible to realize a high matching level. In addition, the bridge 120 can be kept embedded at a constant depth.

Each of the dies 130 and 140 may be mounted on the wiring substrate 110A through the plurality of connection conductors 150. The dies 130 and 140 may be electrically connected to each other through the bridge 120. Each of the dies 130 and 140 may be a semiconductor chip. Each of the semiconductor chips may include an integrated circuit (IC) in which several hundreds to several millions or more of elements are integrated in one chip. In this case, the integrated circuit may be, for example, a logic chip such as a central processor (e.g., a CPU), a graphics processor (e.g., a GPU), a field programmable gate array (FPGA), a digital signal processor, a cryptographic processor, a microprocessor, a microcontroller, an application processor (e.g., an AP), an analog-to-digital converter, or an application-specific IC (ASIC). However, the integrated circuit is not limited thereto, and may include a memory chip such as a volatile memory (e.g., a DRAM), a non-volatile memory (e.g., a ROM), a flash memory, or a high bandwidth memory (HBM), or another type of chip such as a power management IC (PMIC). As a non-limiting example, the first die 130 may include a logic chip such as a GPU, and the second die 140 may include a memory chip such as an HBM, but the first and second dies 130 and 140 are not limited thereto.

Each of the dies 130 and 140 may be formed based on an active wafer. In this case, as a base material constituting a body of each of the dies 130 and 140, silicon (Si), germanium (Ge), gallium arsenide (GaAs), or the like may be used. In the body, various circuits may be formed. An electrode pad may be formed on each body, and the electrode pad may include a conductive material such as aluminum (Al) or copper (Cu). Each of the dies 130 and 140 may be a bare die, and in this case, a metal bump may be disposed on the electrode pad if necessary. Each of the dies 130 and 140 may be a packaged die. In this case, a redistribution layer may additionally be formed on the electrode pad, and a metal bump may be disposed on the redistribution layer if necessary. The metal bump may be connected to the plurality of connection conductors 150.

The plurality of connection conductors 150 may attach the plurality of dies 130 and 140 to the wiring substrate 110A. The plurality of connection conductors 150 may be formed of a low-melting point metal having a lower melting point than copper (Cu), e.g., tin (Sn) or an alloy containing tin (Sn). More specifically, the plurality of connection conductors 150 may include solder, but are not limited thereto. The plurality of connection conductors 150 may be connected to the uppermost wiring layer 112d of the plurality of wiring layers 112. More specifically, the uppermost wiring layer 112d of the plurality of wiring layers 112 may include a plurality of bump pads 112dP, and the plurality of connection conductors 150 may be disposed on the plurality of bump pads 112dP, respectively, to be connected to the plurality of bump pads 112dP, respectively. At least some of the plurality of bump pads 112dP may be electrically connected to the plurality of connection pads 120P of the bridge 120, and accordingly, at least some of the plurality of connection conductors 150 may also be electrically connected to the plurality of connection pads 120P of the bridge 120.

The plurality of electrical connection metals 160 may physically and/or electrically connect the wiring substrate 110A to the outside. For example, the wiring substrate 110A may be a BGA type substrate. The plurality of electrical connection metals 160 may include a low-melting point metal having a lower melting point than copper (Cu), e.g., tin (Sn) or an alloy containing tin (Sn). For example, the plurality of electrical connection metals 160 may include solder, but this is merely an example, and the material thereof is not particularly limited thereto. The plurality of electrical connection metals 160 may be lands, balls, pins, or the like. The plurality of electrical connection metals 160 may be multi-layered or single-layered. Each of the plurality of electrical connection metals 160 may include a copper pillar and solder when multi-layered, and may include solder when single-layered, but this is merely an example, and the material thereof is not particularly limited thereto. The plurality of electrical connection metals 160 may be connected to the lowermost wiring layer 112f of the plurality of wiring layers 112.

Figure 7:
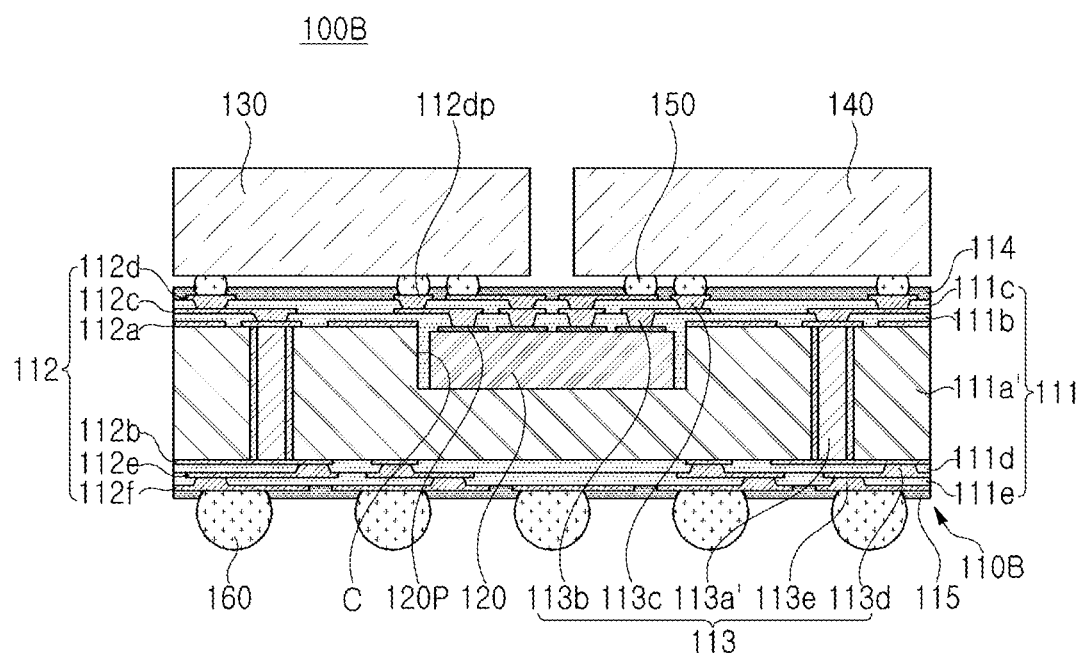
FIG. 7 is a schematic cross-sectional view illustrating a printed circuit board according to another exemplary embodiment.
Figures 8A, 8B, 8C, 8D:
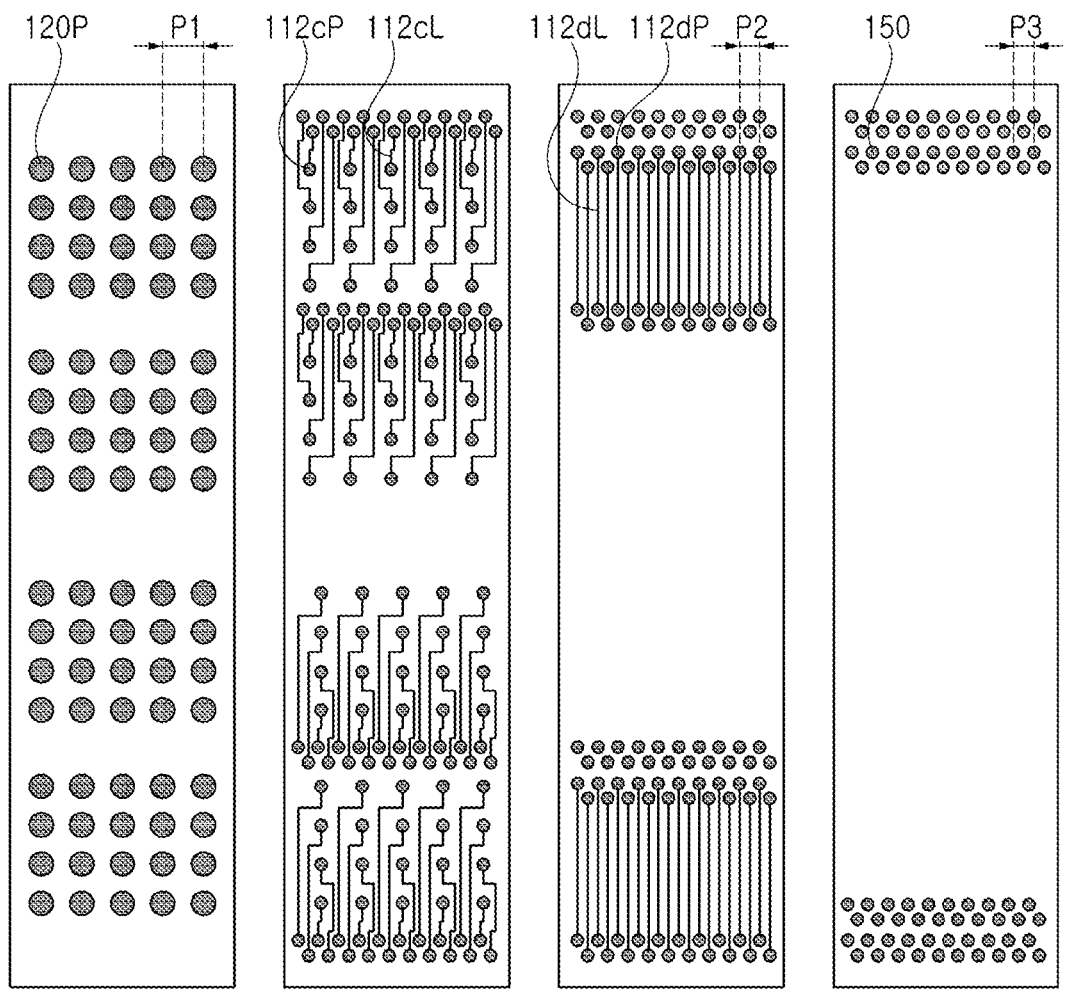
FIGS. 8A through 8D are schematic plan views illustrating connection pads of a bridge, a plurality of first build-up wiring layers of a wiring substrate, and a plurality of connection conductors in comparison with each other.

FIG. 7 is a schematic cross-sectional view illustrating a printed circuit board according to another exemplary embodiment.

Referring to FIG. 7, in the printed circuit board 100B according to another exemplary embodiment, a core layer 111a' may have a larger thickness than the core layer 111a of the printed circuit board 100A, and if necessary, the core layer 111a' may be formed by stacking multiple insulating layers in itself. In addition, a through via layer 113a' penetrating through the core layer 111a' may include a plated through hole (PTH), and the PTH may be filled with a plug material if necessary. In addition, a wiring substrate 110B may have a cavity C penetrating through a portion of the core layer 111a', and a bridge 120 may be disposed in the cavity C in a face-up form. In this case, a lower surface of the bridge 120 may be attached to a bottom surface of the cavity C through an adhesive or the like, but is not limited thereto. Meanwhile, when the bridge 120 is disposed in the cavity C of the core layer 111a', it is also possible to sufficiently secure a thickness of the bridge 120, and thus the above-described effects can be obtained. Meanwhile, at least a portion of the cavity C may be filled by at least a portion of at least one build-up layer 111b of the plurality of first build-up layers 111b and 111c.

The other details, for example, the details described above for the printed circuit board 100A according to an exemplary embodiment, may also be applicable to the printed circuit board 100B according to another exemplary embodiment unless contradictory, and the overlapping description will not be repeated.

FIGS. 8A through 8D are schematic plan views illustrating the connection pads of the bridge, the plurality of first build-up wiring layers of the wiring substrate, and the plurality of connection conductors in comparison with each other.

FIGS. 8A through 8D may be respective top views of the plurality of connection pads 120P, the lower wiring layer 112c of the plurality of first build-up wiring layers 112c and 112d, the upper wiring layer 112d of the plurality of first build-up wiring layers 112c and 112d, and the plurality of connection conductors 150, which are applicable to the above-described printed circuit boards 100A and 100B. In the plan views of FIGS. 8A through 8D, they are illustrated to correspond to each other. The details to be described below may also be applicable to the above-described printed circuit boards 100A and 100B.

Referring to FIGS. 8A through 8D, the lower wiring layer 112c of the plurality of first build-up wiring layers 112c and 112d may include a plurality of via pads 112cP and a plurality of first line patterns 112cL. In addition, the upper wiring layer 112d of the plurality of first build-up wiring layers 112c and 112d may include a plurality of bump pads 112dP and a plurality of second line patterns 112dL. The plurality of connection pads 120P may be connected to at least some of the plurality of via pads 112cP through the connection vias of the first connection via layer 113b. At least some of the plurality of via pads 112cP may be connected to at least some of the plurality of bump pads 112dP through the connection vias of the second connection via layer 113c. At least some of the plurality of bump pads 112dP may be connected to the plurality of connection conductors 150.

In this case, a pitch P1 between at least two adjacent connection pads of the plurality of connection pads 120P may be larger than a pitch P2 between at least two adjacent ones of the plurality of bump pads 112dP and a pitch P3 between at least two adjacent ones of the plurality of connection conductors 150. For example, the larger pitch may refer to a larger distance between respective center lines of two objects when viewed in the plan view. The pitches may be measured using a scanning microscope or the like. In addition, at least one of the plurality of connection pads 120P may have a larger area than at least one of the plurality of bump pads 112dP in the plan view. For example, at least one of the plurality of connection pads 120P may have a larger diameter than at least one of the plurality of bump pads 112dP when viewed in the plan view. The diameters may be measured using a scanning microscope or the like. In this relationship, the plurality of connection pads 120P can be redistributed through the plurality of first build-up wiring layers 112c and 112d. As the number of first build-up wiring layers increases, the positions of the pads can be shifted to match a desired design, and as a result, the pitch between the pads can be substantially the same as the pitch between the bumps. This may be the same in a case in which the number of first build-up wiring layers 112c and 112d increase. In this way, by using the bridge 120 including the plurality of connection pads 120P having a sufficient size and a sufficient pitch, the bridge 120 can be less affected by a positional tolerance when mounted, resulting in a high matching level.

Figure 9:
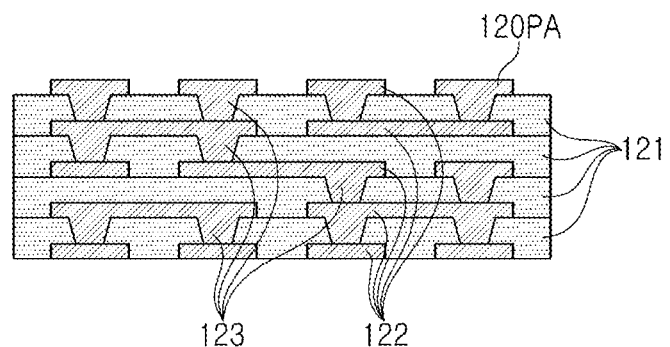
FIG. 9 is a schematic cross-sectional view illustrating a bridge according to an exemplary embodiment.

FIG. 9 is a schematic cross-sectional view illustrating a bridge according to an exemplary embodiment.

Referring to FIG. 9, the bridge 120A according to an exemplary embodiment may include a coreless substrate. For example, the coreless substrate may include a plurality of resin layers 121, a plurality of circuit layers 122, and a plurality of conductor via layers 123. In this case, an uppermost one of the plurality of circuit layers 122, that is, a circuit layer 122 protruding from the plurality of resin layers 121 may include a plurality of connection pads 120PA. The bridge 120A according to an exemplary embodiment may be applied to the above-described printed circuit boards 100A and 100B.

The plurality of resin layers 121 may provide a body of the bridge 120A. The plurality of resin layers 121 may include an organic insulating material. In this case, the organic insulating material may be a thermosetting resin such as an epoxy resin, a thermoplastic resin such as a polyimide resin, or a resin in which the thermosetting or thermoplastic resin is mixed with an inorganic filler such as silica or impregnated in a core material of an inorganic filler, for example, prepreg, ABF, FR-4, or BT. The number of resin layers 121 is not particularly limited, and may be modified in various manners depending on design. A boundary between the plurality of resin layers 121 may be distinct or obscure.

The plurality of circuit layers 122 may provide a die-to-die interconnection path. The plurality of circuit layers 122 may perform various functions depending on how the respective layers are designed, and may include at least signal patterns. The plurality of circuit layers 122 may include a conductive material, in particular a metal material, such as copper (Cu), aluminum (Al), silver (Ag), tin (Sn), gold (Au), nickel (Ni), lead (Pb), titanium (Ti), or an alloy thereof. Each of the plurality of circuit layers 122 may include an electroless plating layer (or chemical copper) and an electrolytic plating layer (or electrical copper). The number of circuit layers 122 is also not particularly limited, and may be modified in various manners depending on design. For example, the number of circuit layers 122 may be about 5 to 20, but is not limited thereto.

The plurality of conductor via layers 123 may electrically connect the plurality of circuit layers 122 formed in different layers, as a result forming an electrical path in the bridge 120A. The plurality of conductor via layers 123 may perform various functions depending on how the respective layers are designed, and may include at least signal vias. Each of the plurality of conductor via layers 123 may include a plurality of conductor vias. Each of the conductor vias in the plurality of conductor via layers 123 may include a conductive material, in particular a metal material, such as copper (Cu), aluminum (Al), silver (Ag), tin (Sn), gold (Au), nickel (Ni), lead (Pb), titanium (Ti), or an alloy thereof. Each of the conductor vias in the plurality of conductor via layers 123 may include an electroless plating layer (or chemical copper) and an electrolytic plating layer (or electrical copper). Each of the conductor vias in the plurality of conductor via layers 123 may be of a type in which a via hole is filled with the conductive material, or may be of a conformal type in which the conductive material is disposed along a wall surface of a via hole. The conductor vias in the plurality of conductor via layers 123 may be tapered in the same direction.

Figure 10:
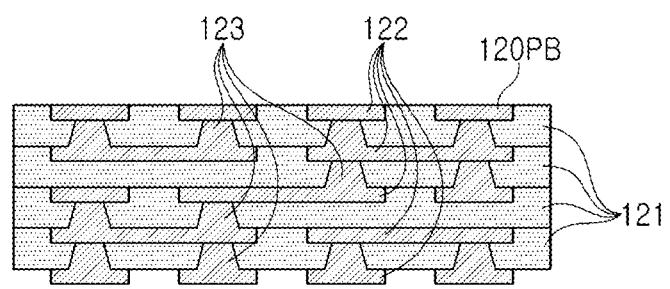
FIG. 10 is a schematic cross-sectional view illustrating a bridge according to another exemplary embodiment.

FIG. 10 is a schematic cross-sectional view illustrating a bridge according to another exemplary embodiment.

Referring to FIG. 10, the bridge 120B according to another exemplary embodiment may include a coreless substrate. Unlike the bridge 120A according to an exemplary embodiment, the bridge 120B according to another exemplary embodiment may include a plurality of connection pads 120PB embedded in a plurality of resin layers 121. For example, in order to secure the flatness of the plurality of connection pads 120PB, when the bridge 120B is manufactured by a coreless process, the plurality of connection pads 120PB may be first formed toward a carrier substrate.

The other details, for example, the details described above for the bridge 120A according to an exemplary embodiment, may also be applicable to the bridge 120B according to another exemplary embodiment unless contradictory, and the overlapping description will not be repeated.

Figure 11:
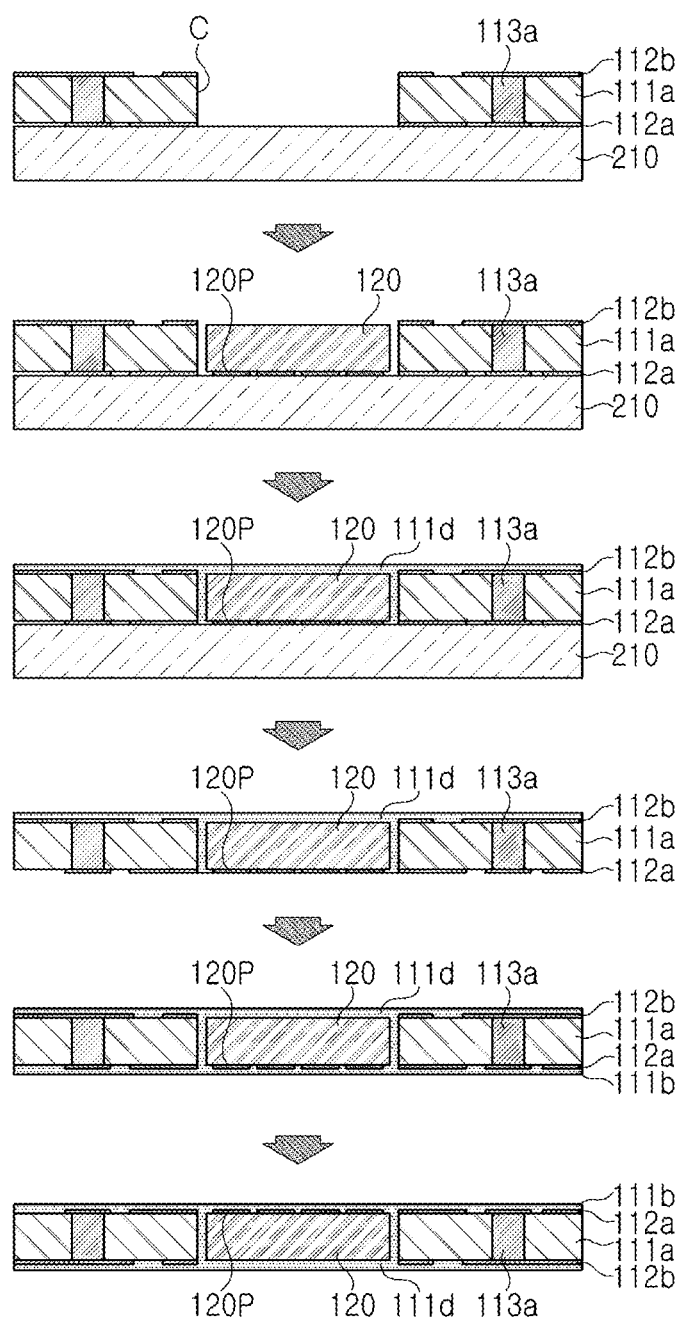
FIG. 11 is a schematic view illustrating an example of a process of embedding a bridge in the printed circuit board according to an exemplary embodiment of FIG. 6.

FIG. 11 is a schematic view illustrating an example of a process of embedding a bridge in the printed circuit board according to an exemplary embodiment of FIG. 6.

Referring to FIG. 11, after preparing a core layer 111a having a through portion H therein together with first and second core wiring layers 112a and 112b and a through via layer 113a, the same may be attached onto a detachable film 210. Next, a bridge 120 may be attached onto the film 210 in the through portion H. Next, a second build-up layer 111d may be stacked on the film 210 to embed the bridge 120. Next, the film 210 may be removed. Next, a first build-up layer 111b may be stacked on a region in which the film 210 is removed. If necessary, the laminate formed by a series of steps may be turned over. The bridge 120 may be embedded in the above-described printed circuit board 100A according to an exemplary embodiment through a series of steps, but is not limited thereto. The other overlapping description will not be repeated.

Figure 12:
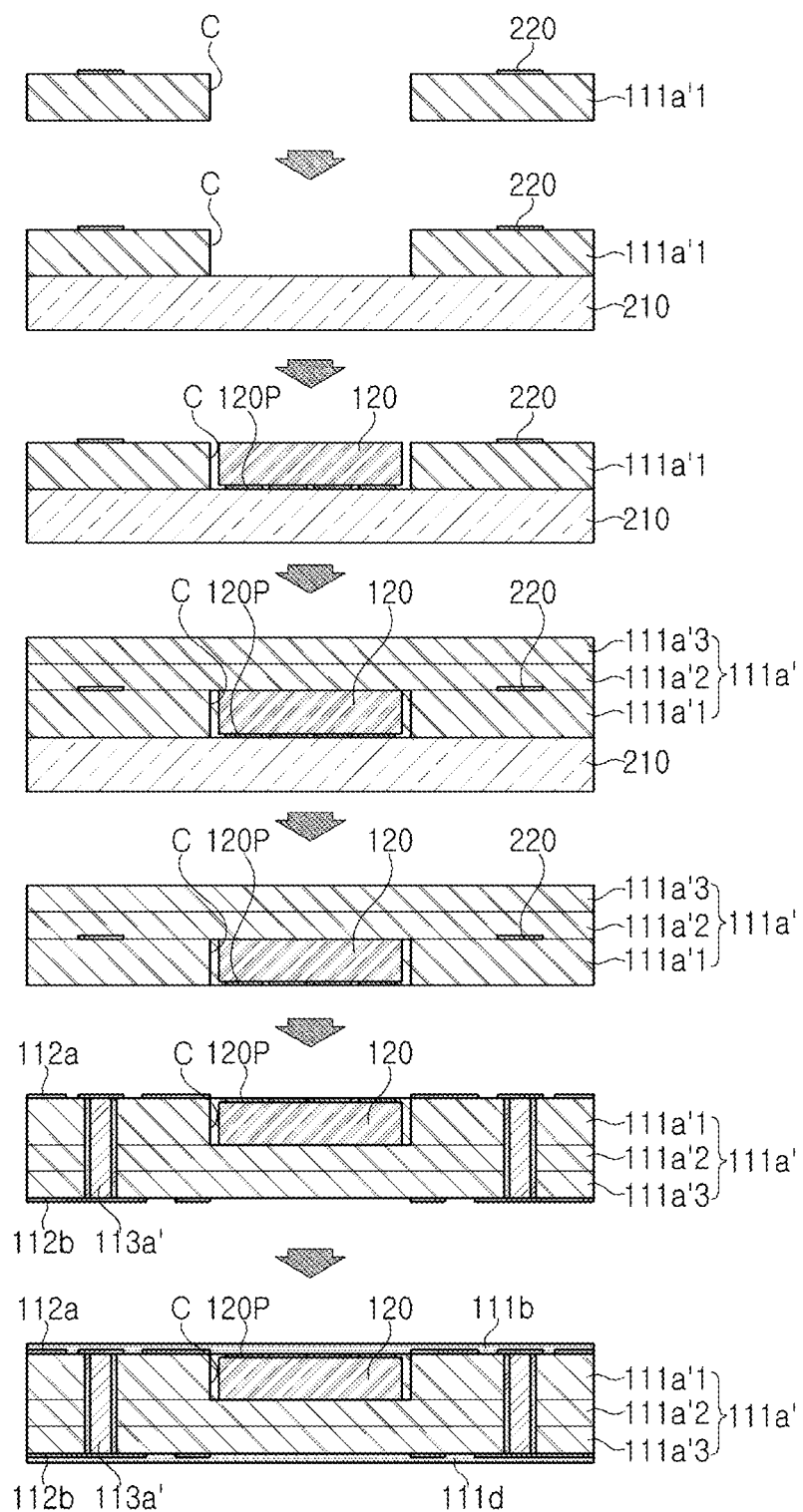
FIG. 12 is a schematic view illustrating an example of a process of embedding a bridge in the printed circuit board according to another exemplary embodiment of FIG. 7.

FIG. 12 is a schematic view illustrating an example of a process of embedding a bridge in the printed circuit board according to another exemplary embodiment of FIG. 7.

Referring to FIG. 12, a first core insulating layer 111a'1 in which a through portion H is formed may be prepared. If necessary, an alignment mark 220 may be formed on the first core insulating layer 111a'1. Next, the first core insulating layer 111a'1 may be attached onto a film 210. Next, a bridge 120 may be attached onto the film 210 in the through portion H. Next, a second core insulating layer 111a'2 and a third core insulating layer 111a'3 may be stacked on the film 210 to embed the bridge 120. The second core insulating layer 111a'2 may include the same type of insulating material as the first and third core insulating layers 111a'1 and 111a'3, but is not limited thereto, and may include a different type of insulating material from the first and third core insulating layers 111a'1 and 111a'3. The through portion H may be filled with the second core insulating layer 111a'2, but is not limited thereto. Next, the film 210 may be removed. Next, first and second core wiring layers 112a and 112b and a through via layer 113a' may be formed on and in the core layer 111a'. If necessary, the laminate formed by a series of steps may be turned over. Next, first and second build-up layers 111b and 111d may be stacked on both sides of the laminate. The bridge 120 may be embedded in the above-described printed circuit board 100B according to another exemplary embodiment through a series of steps, but is not limited thereto. The other overlapping description will not be repeated.

As set forth above, as one effect of the present disclosure, it is possible to provide a printed circuit board allowing a bridge capable of die-to-die interconnection to be embedded therein.

As another effect of the present disclosure, it is possible to provide a printed circuit board capable of realizing a high matching level.

As another effect of the present disclosure, it is possible to provide a printed circuit board capable of solving a reliability problem.

As another effect of the present disclosure, it is possible to provide a printed circuit board capable of reducing a cost.

While exemplary embodiments have been shown and described above, it will be apparent to those skilled in the art that modifications and variations could be made without departing from the scope of the present invention as defined by the appended claims.

What is claimed is:

1. A printed circuit board comprising:
   a wiring substrate including a plurality of insulating layers, a plurality of wiring layers, and a plurality of via layers; and
   a bridge embedded in at least one of the plurality of insulating layers of the wiring substrate at a depth such that an upper surface of a body of the bridge is below an upper surface of a wiring layer of the plurality of wiring layers disposed on the at least one of the plurality of insulating layers of the wiring substrate, and having a plurality of connection pads disposed on the upper surface of the body of the bridge,
   wherein an uppermost wiring layer of the plurality of wiring layers includes a plurality of bump pads connected to the plurality of connection pads,
   the plurality of connection pads include a row of connection pads spaced apart from each other,
   the plurality of bump pads include a row of bump pads spaced apart from each other, and
   each distance between center lines of every two adjacent connection pads of the row of connection pads is larger than each distance between center lines of every two adjacent bump pads of the row of bump pads,
   the plurality of connection pads have a size greater than the plurality of bump pads.

2. The printed circuit board of claim 1, wherein the plurality of insulating layers include a core layer which is thicker than each of other layers of the plurality of insulating layers,
   the wiring substrate has a through portion penetrating through the core layer, and
   the bridge is disposed in the through portion in a face-up form such that the plurality of connection pads face the uppermost wiring layer.

3. The printed circuit board of claim 2, wherein the plurality of insulating layers further include a plurality of first and second build-up layers disposed on upper and lower sides of the core layer, respectively, and
   at least a portion of the through portion is filled by at least a portion of at least one of the plurality of first and second build-up layers.

4. The printed circuit board of claim 1, wherein the plurality of insulating layers include a core layer which is thicker than each of other layers of the plurality of insulating layers, the wiring substrate has a cavity penetrating through a portion of the core layer, and the bridge is disposed in the cavity in a face-up form such that the plurality of connection pads face the uppermost wiring layer.

5. The printed circuit board of claim 4, wherein the plurality of insulating layers further include a plurality of first and second build-up layers disposed on upper and lower sides of the core layer, respectively, and at least a portion of the cavity is filled by at least a portion of at least one of the plurality of first build-up layers.

6. The printed circuit board of claim 1, wherein the bridge includes a coreless substrate.

7. The printed circuit board of claim 6, wherein the coreless substrate includes a plurality of resin layers, a plurality of circuit layers, and a plurality of conductor via layers, and an uppermost one of the plurality of circuit layers includes the plurality of connection pads.

8. The printed circuit board of claim 7, wherein the plurality of resin layers include an organic insulating material.

9. The printed circuit board of claim 1, further comprising a plurality of connection conductors disposed on the plurality of bump pads, respectively, to be connected to the plurality of bump pads, respectively, wherein each distance between the centers of at least two adjacent connection pads of the plurality of connection pads is larger than each distance between centers of at least two adjacent ones of the plurality of connection conductors.

10. The printed circuit board of claim 9, further comprising first and second dies adjacent to each other and each mounted on the wiring substrate through the plurality of connection conductors and connected to each other through the bridge, wherein the first die includes a logic chip, and the second die includes a memory chip.

11. The printed circuit board of claim 1, further comprising a plurality of electrical connection metals each disposed on a lowermost one of the plurality of wiring layers to be connected to the lowermost wiring layer.

* * * * *